(12) United States Patent
Colinet et al.

(10) Patent No.: US 8,183,945 B2
(45) Date of Patent: May 22, 2012

(54) OSCILLATOR BASED ON SERIES OF FOUR NANOWIRES

(75) Inventors: Eric Colinet, Meylan (FR); Laurent Duraffourg, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 157 days.

(21) Appl. No.: 12/710,695

(22) Filed: Feb. 23, 2010

(65) Prior Publication Data
US 2010/0219897 A1    Sep. 2, 2010

(30) Foreign Application Priority Data

Feb. 27, 2009   (FR) ...................................... 09 00905

(51) Int. Cl.
*H03B 5/30*   (2006.01)
(52) U.S. Cl. ...................... 331/154; 331/57; 331/116 M
(58) Field of Classification Search .................... 331/57, 331/116 M, 154
See application file for complete search history.

(56) References Cited

U.S. PATENT DOCUMENTS

| | | | | |
|---|---|---|---|---|
| 5,731,727 | A * | 3/1998 | Iwamoto et al. | 327/281 |
| 7,164,744 | B2 * | 1/2007 | Bertin | 326/30 |
| 7,330,080 | B1 * | 2/2008 | Stoiber et al. | 331/57 |
| 2006/0001496 | A1 * | 1/2006 | Abrosimov et al. | 331/57 |

FOREIGN PATENT DOCUMENTS

| | | |
|---|---|---|
| WO | WO 2006/067757 A1 | 6/2006 |
| WO | WO 2007/036820 A2 | 4/2007 |

OTHER PUBLICATIONS

Javey et al. ("Carbon Nanotube Transistor Arrays for Multistage Complementary Logic and Ring Oscillators, Nano Letters, vol. 2, No. 9, 2002").*
Rongrui, H. et al., "Giant Piezoresistance Effect in Silicon Nanowire," Nature Nanotechnology, 2006, vol. 1, pp. 42-46.
Feng, X. et al., "Very High Frequency Silicon Nanowire Electromechanical Resonators," Nano Letters, 2007, vol. 7, No. 7, pp. 1953-1959.
Rongrui, H. et al., "Self-Transducing Silicon Nanowire Electromechanical Systems at Room Temperature," Nano Letters, 2008, vol. 8, No. 6, pp. 1756-1761.
Sheenan, D. et al., "Intrinsically Biased, Resonant NEMS-MEMS Oscillator and the Second Law or Thermodynamics," Physica E, vol. 29, 2005, pp. 87-99.
Toriyama, T. et al., "Single Crystal Silicon Piezoresistive Nano-Wire Bridge," Sensors and Actuators, vol. 108, 2003, pp. 244-249.
Feng, X. et al., "Phase Noise and Frequency Stability of Very-High Frequency Silicon Nanowire Nanomechanical Resonators," The 14th International Conference on Solid-State Sensors Actuators and Microsystems, 2007, pp. 327-330.

* cited by examiner

*Primary Examiner* — James E Goodley
(74) *Attorney, Agent, or Firm* — Oliff & Berridge, PLC

(57) ABSTRACT

The oscillator comprises at least a first series of a multiple of four sub-assemblies each of which comprises an excitation terminal and an output terminal. The sub-assemblies are arranged in series in a closed loop. The output terminal of each sub-assembly is connected to the excitation terminal of the following sub-assembly. The output terminal of one of the sub-assemblies constitutes the output terminal of the oscillator. Each sub-assembly comprises excitation means and a nanowire which constitutes the electromechanical resonator and the piezoresistive detection means of movement of the resonator. A first terminal of the nanowire is connected to a first supply voltage. The second terminal of the nanowire constitutes the output terminal of the sub-assembly which is grounded via a corresponding resistive circuit. An input terminal of the excitation means constitutes the excitation terminal of the sub-assembly.

8 Claims, 3 Drawing Sheets

OSCILLATOR BASED ON SERIES OF FOUR NANOWIRES

BACKGROUND OF THE INVENTION

The invention relates to an oscillator comprising at least an electro-mechanical resonator, excitation means of the resonator and detection means of movement of the resonator.

STATE OF THE ART

In order to be able to continue the race towards miniaturization, micro-electronic circuits are having to integrate new functions while at the same time minimizing the surface area of the circuits. One of the major fields of study is integration of resonant devices within chips. Indeed, in a large number of fields, such as gas-phase chemical sensors, molecular force sensors or mass spectrometers, it is of interest for the integrated circuit to comprise at least one oscillator. Designers are working on replacing the oscillator, which is an additional discrete component, by an integrated oscillator. By integrating this oscillator, it can then be hoped to obtain a gain in the energy consumed, in addition to the gain in surface area or in volume of the device, and an improvement of performances.

Numerous publications deal with electromechanical resonators of micrometric or nanometric size, i.e. resonators having dimensions compatible with those of integrated circuits. However, although obtaining a resonator of reasonable size is an important point, in order to transform a resonator into an oscillator, the electronic part that is associated with the latter also has to be compatible with the very stringent specifications of the integrated circuit, which at present proves to be very difficult.

OBJECT OF THE INVENTION

The object of the invention is to provide an oscillator that is extremely compact and that is easy to implement.

The oscillator according to the invention is characterized in that it comprises at least a first series of a multiple of four sub-assemblies each comprising an excitation terminal and an output terminal, the sub-assemblies being arranged in series in a closed loop, the output terminal of each sub-assembly being connected to the excitation terminal of the following sub-assembly, the oscillator comprising an output terminal formed by an output terminal of one of the sub-assemblies, each sub-assembly comprising the excitation means and at least one nanowire constituting the electromechanical resonator, a first terminal of the nanowire being connected to a first supply voltage, a second terminal of the nanowire forming the output terminal, and an input terminal of the excitation means forming the excitation terminal of the sub-assembly, the output terminal of each sub-assembly is grounded by means of a corresponding resistive circuit.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
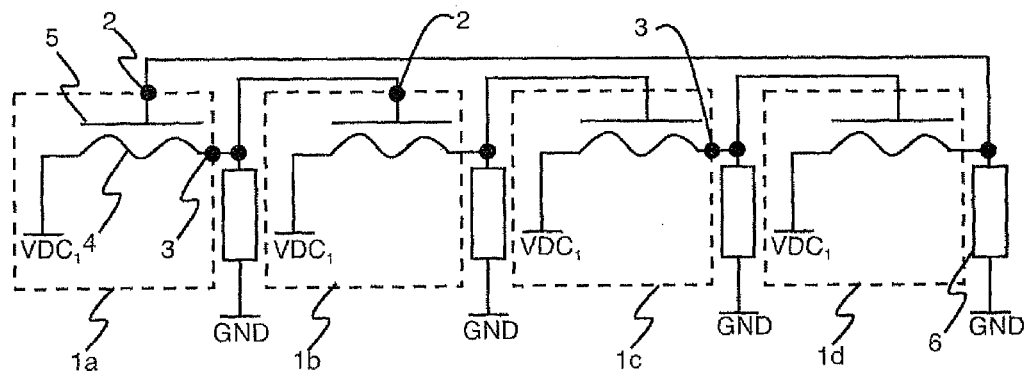
FIG. 1 represents a first embodiment of an oscillator.

As illustrated in FIG. 1, the oscillator comprises a first series of four sub-assemblies 1 (1a, 1b, 1c and 1d) which are connected together in series to form a closed loop. Each sub-assembly 1 of the first series comprises an excitation terminal 2 and an output terminal 3 and is connected to two other adjacent sub-assemblies 1. If the first series is considered to comprise first 1a, second 1b, third 1c and fourth 1d sub-assemblies, second sub-assembly 1b is connected to first sub-assembly 1a and to third sub-assembly 1c. Third sub-assembly 1c is also connected to fourth sub-assembly 1d which is itself connected to first sub-assembly 1a.

Each sub-assembly 1 comprises a resonator 4, excitation means 5 of the resonator and detection means of movement of the resonator. In each sub-assembly 1, a nanowire 4 constitutes an electromechanical resonator. Movement of the nanowire 4 is converted into a representative electric signal by a suitable transductance means formed by the detection means of the sub-assembly. The detection means are advantageously of piezoresistive type and are formed directly by nanowire 4 which presents a giant piezo-resistance effect as is described in the article by He et al. ("Giant piezoresistance effect in silicon nanowires" Nature nanotechnology, vol. 1, October 2006, pp 42-46). Each sub-assembly 1 therefore comprises excitation means 5 of nanowire 4. Each sub-assembly comprises at least one nanowire, i.e. a nanowire as in the embodiments illustrated in FIGS. 1 to 3, or a plurality of nanowires as in the embodiments illustrated in FIGS. 4 and 5.

In each sub-assembly 1 of the first series, a first terminal of nanowire 4 is connected to a first supply voltage ($VDC_1$), and a second terminal of nanowire 4 constitutes output terminal 3 of sub-assembly 1. An input terminal of excitation means 5 constitutes excitation terminal 2 of sub-assembly 1. Output terminal 3 of each sub-assembly 1 is connected to ground GND by means of a corresponding resistive circuit 6.

To form a closed loop, output terminal 3 of each sub-assembly 1 is connected to excitation terminal 2 of the following sub-assembly 1. The direction of data transit in a sub-assembly 1 is thus considered to be from an excitation terminal 2 to an output terminal 3. The oscillator comprises an output terminal which is formed by output terminal 3 of one of sub-assemblies 1. The oscillator also comprises an input terminal which is formed by excitation terminal 2 of the sub-assembly which follows the sub-assembly comprising the output terminal of the oscillator.

Resistive circuit 6 can be formed by a resistor, a field-effect or bipolar transistor, a resistive bridge or any other component capable of converting a current variation into a voltage variation.

For example purposes, if the output terminal of the signal representative of the oscillator is formed by output terminal 3 of fourth sub-assembly 1d, the input terminal of an electric signal in the oscillator is formed by excitation terminal 2 of first sub-assembly 1a.

In this way, each sub-assembly 1 transmits a signal representative of the movement of its nanowire 4 to excitation means 5 of the following sub-assembly 1 which controls actuation of the following nanowire 4. The voltage at the terminals of resistive circuit 6 associated with the output terminal of the oscillator, here resistive circuit 6 associated with fourth sub-assembly 1d, is representative of the current delivered by fourth nanowire 4. The signal emitted by the detection means is converted into a voltage by means of resistive circuit 6 to generate an actuating force on the following nanowire 4 and to thereby fulfil the oscillation conditions.

The dynamics of the four nanowires 4 of the first series enable the phase condition necessary for obtaining an oscillator to be fulfilled without an external phase-shift element being added. Moreover, the giant piezo-resistance effect observed in the nanowires enables gain values necessary for triggering oscillation to be achieved. Each sub-assembly performing a 90° phase shift, the use of a first series of four sub-assemblies 1 results in a global phase shift of 0° necessary to maintain the oscillations of the resonators in the oscillator. It is also conceivable to produce an oscillator comprising a multiple of four sub-assemblies 1 in order to obtain a global phase shift of 0°. The first series of sub-assemblies can therefore for example contain four, eight, twelve, sixteen or more sub-assemblies.

Excitation of each nanowire 4 is performed independently by excitation means 5 of capacitive or magnetic, or possibly thermal, type. In the case of capacitive excitation, the electrostatic force of excitation means 5 is obtained by means of the voltage difference that exists between supply voltage VDC applied to nanowire 4 (a DC voltage) and the output voltage of the detection means of the previous sub-assembly 1 (an AC voltage). The output voltage of the detection means of the previous sub-assembly 1 is applied to an electrode of the excitation means. Use of magnetic excitation means has been described by Feng et al. "Very High Frequency Silicon Nanowire Electromechanical Resonators" Nano Letters 2007, Vol. 7, No. 7. pp 1953-1957.

Figure 2:
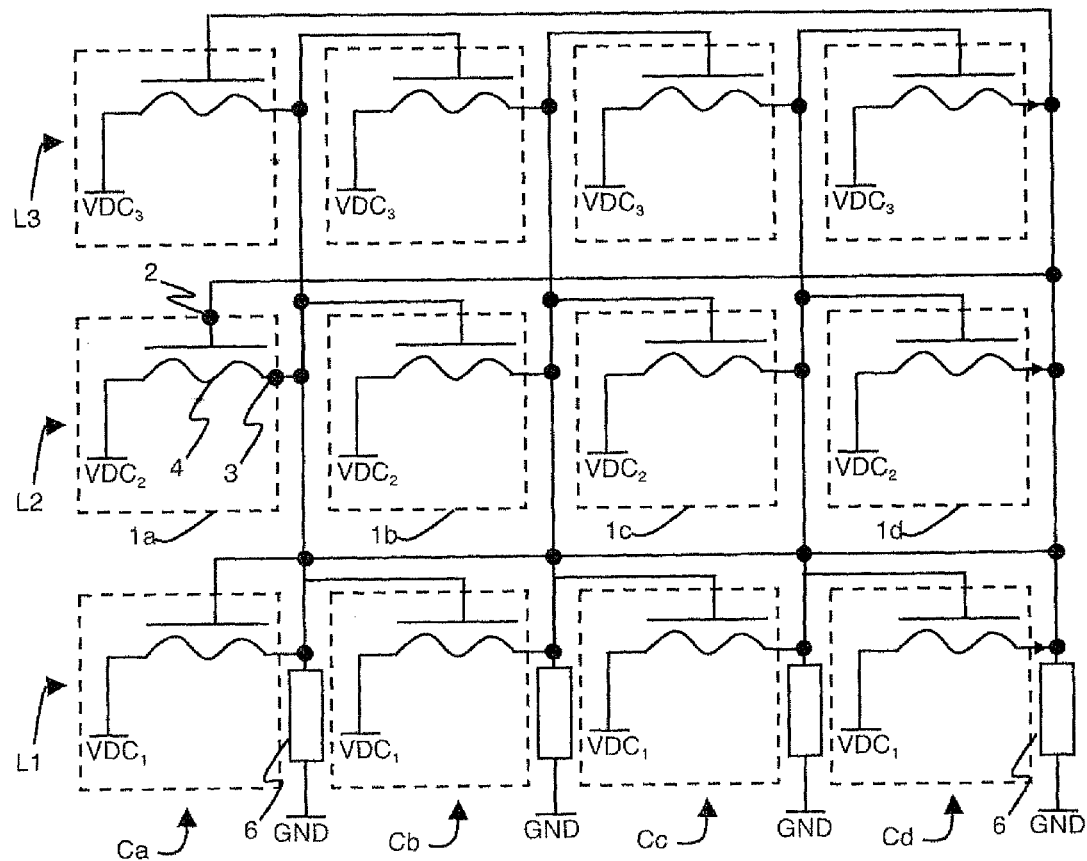
FIG. 2 represents a second embodiment of an oscillator.
Figure 3:
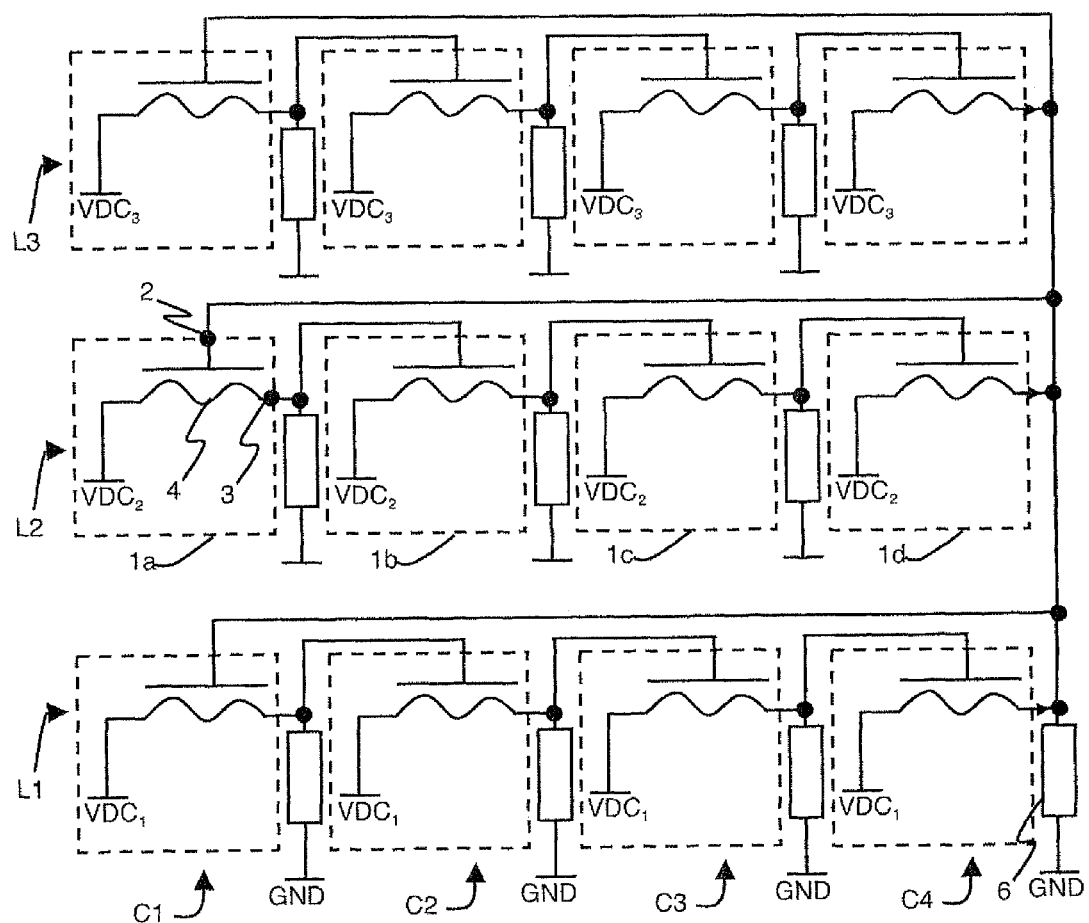
FIG. 3 represents a third embodiment of an oscillator.

If the gain of the piezoresistive transductance performed by nanowires 4 is insufficient, it is advantageous to use at least one additional series of four sub-assemblies 1 (FIGS. 2 and 3). These sub-assemblies are identical in their construction to those of the first series. In the additional series, the nanowires are connected to a specific additional supply voltage VDCn.

In a particular embodiment, additional supply voltage VDCn is identical to first supply voltage $VDC_1$.

The use of at least one additional series of four sub-assemblies 1 enables the transductance gain to be increased so as to comply with the global oscillation condition of resonators 4.

In a particular use, adjustment of supply voltage VDC of the different series of sub-assemblies enables a voltage-controlled oscillator to be obtained.

In a first alternative embodiment illustrated in FIG. 2, a plurality of additional series each comprising four sub-assemblies 1 is integrated in the oscillator.

in this alternative embodiment, a sub-assembly 1 of each additional series is connected in parallel to excitation terminal 2 and output terminal 3 of a corresponding sub-assembly 1 of the first series. This results in the oscillator comprising four columns (Ca, Cb, Cc and Cd) of sub-assemblies 1 and in all the columns presenting the same number of sub-assemblies 1. Thus, schematically, all the excitation terminals 2 of the sub-assemblies of any one column are connected to the same electric point, as they all receive the same signal, i.e. the same voltage. The same is the case for all the output terminals 3 of sub-assemblies 1 of any one column. The currents supplied by the nanowires of any one column in fact create a voltage at the terminals of resistive circuit 6 associated with this column that is representative of the sum of the supplied currents. This output voltage is then applied to all the excitation means 5 of the next column. In the particular embodiment of FIG. 2, only three series of sub-assemblies are illustrated, each series having its own supply voltage $VDC_1$, $VDC_2$, $VDC_3$. Each series is represented in FIG. 2 by a line (L1, L2 and L3) of sub-assemblies that in addition comprises its own supply voltage.

In a second alternative embodiment illustrated in FIG. 3, a plurality of additional series each comprising four sub-assemblies 1a, 1b, 1c and 1d is also integrated in the oscillator. In each additional series, connection of the sub-assemblies 1 to one another is substantially identical to that of the first series. Output terminal 3 of three consecutive sub-assemblies is connected to ground GND via a corresponding resistive circuit 6. Each series is represented in FIG. 3 by a line (L1, L2 and L3) of sub-assemblies which in addition comprises its own supply voltage.

Thus, output terminal 3 of one of the sub-assemblies being connected to the output terminal of the oscillator, output terminals 3 of the sub-assemblies of the additional series that are not connected to the output of the oscillator are connected to GND via a corresponding resistive circuit 6. In the example illustrated in FIG. 3, first, second and third sub-assemblies 1 are grounded via their output terminal 3 and via a resistive circuit 6 whereas output terminal 3 of fourth sub-assembly 1d is connected directly to output terminal 3 of the fourth sub-assembly of the first series. As in the previous embodiment, FIG. 3 only illustrates a particular embodiment comprising three series of sub-assemblies having their own supply voltage VDCn.

In this embodiment, as in the previous embodiment, the voltage at the terminals of resistive circuit 6 associated with the output terminal of the oscillator is representative of the sum of the currents provided by the plurality of series of sub-assemblies (the first series and the additional series). The transductance gain of the nanowires is therefore multiplied by the number of series of sub-assemblies integrated in the oscillator.

It is advantageous to use the first alternative embodiment instead of the second alternative embodiment as the first alternative embodiment uses less resistive circuits thereby enabling the surface area used to be reduced.

Nanowires 4 that form the resonators and detection means can present a square, rectangular or circular cross-section. The dimensions of the nanowire in this cross-section are typically smaller than 100 nm, for example between 10 and 40 nm. For example, if the diameter of the nanowire is equal to 10 nm and the length is equal to 1.15 µm, the resonance frequency has to be equal to 50 MHz. If its length is equal to 600 nm, the resonance frequency is then equal to 200 MHz. If the nanowire has a square cross-section, a thickness equal to 20 nm and a length equal to 1.30 µm, the resonance frequency is equal to 100 MHz. If the thickness is equal to 40 nm and the length is equal to 1.90 µm, the resonance frequency is equal to 100 MHz.

Advantageously, the equivalent resistance of resistive circuit 6 is chosen equal to the static resistance of nanowire 4 with which this circuit is associated. In a particular embodiment, resistive circuit 6 is formed by a resistance, and in an even more particular embodiment, the resistance constituting the resistive circuit is formed by a nanowire identical to that of the associated sub-assembly but which is not released from its support substrate to prevent oscillation thereof—the nanowire is said to be fixed. Resistive circuit 6 can also be a transistor that is used as a resistance.

It is also possible to adjust the value of the equivalent resistance of the resistive circuit in order to reduce the current leakage originating from the nanowires which also has the effect of modifying the value of the gain linked to the transductance by the nanowires.

The nanowires are made from electrically conducting materials, for example from semi-conducting materials such as silicon, germanium or silicon-germanium alloys. For nanowires made from semi-conducting material, doping has to be performed. Typically, for a silicon nanowire, a doping equal to $10^{19}$ cm$^{-3}$ (with boron) enables a transductance gain of more than one to be obtained. If a weaker doping level is used, as the static resistance of the nanowire is increasing, it may be necessary to provide additional series of sub-assemblies.

For example purposes, for doping of silicon nanowires of about $10^{17}$ cm$^{-3}$ (with boron), about ten additional series of sub-assemblies have to be used. For doping of about $10^{16}$ cm$^{-3}$, about a hundred additional series may be required.

Figure 4:
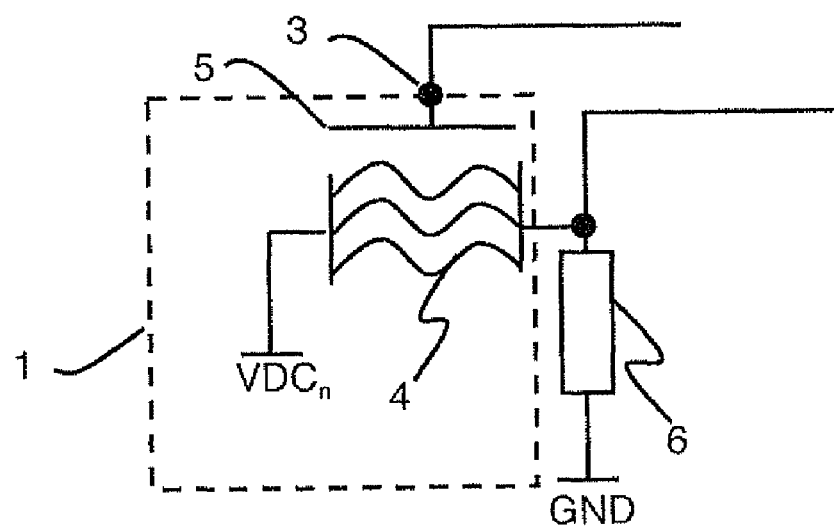
FIGS. 4 and 5 represent a fourth embodiment of an oscillator.
Figure 5:
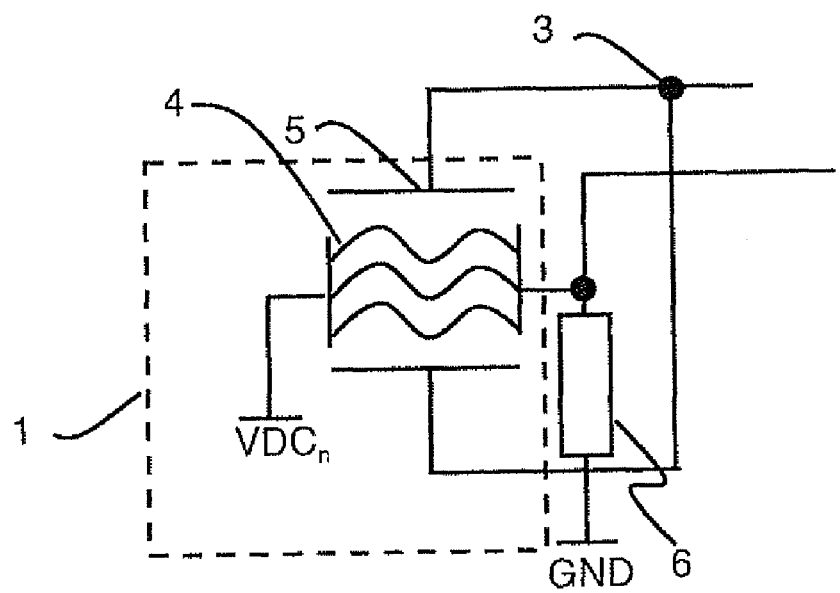

In the embodiment illustrated in FIG. 2, when several series of sub-assemblies 1 are integrated in a single oscillator, the different excitation means 5 of any one column all receive the same signal. They all actuate nanowires 4 in the same way. As illustrated in FIGS. 4 and 5, it is advantageous to arrange the nanowires in a two-dimensional or three-dimensional network and to use an excitation means 5 common to all the nanowires 4 of any one column. The nanowires of any one column can then be addressed collectively, for example by means of a series of metal tracks or doped areas at the surface or by a network of three-dimensional metal interconnections. In this case, excitation terminal 2 and output terminal 3 of the different sub-assemblies 1 of any one column are physically one and the same, as there is one sub-assembly associated with each nanowire.

For example purposes, the nanowire or nanowires of any one column are formed on a SOI substrate and are resting for example on the buried oxide. The nanowires are for example formed by photolithography and etching or by chemical vapor deposition. The buried oxide is then removed in controlled manner underneath a part of the nanowires in order to make movement of the latter possible. The nanowires are then suspended above the substrate situated under the buried oxide and application of a variable voltage between the nanowire and substrate enables the excitation means to apply electrostatic forces capable of making the nanowire resonate.

Thus, in each sub-assembly, excitation means 5 comprise at least one electrode which is arranged facing the nanowire or nanowires. The electrode or electrodes are then connected to the excitation terminal of the excitation means of the sub-assembly.

In the oscillator, there is no feedback loop formed by an electronic circuit which enables an extremely compact, purely electromechanical oscillator to be achieved. The only power input to the oscillator is performed by supply voltage VDC which is a DC voltage applied on each nanowire. Supply voltage VDC enables the amplitude of the oscillations of the nanowires to be controlled.

The invention claimed is:

1. An oscillator comprising:
 a first set of a multiple of four sub-assemblies connected in series in a closed loop, each sub-assembly comprising:
  one nanowire constituting an electromechanical resonator with a first terminal connected to a first supply voltage and a second terminal constituting an output terminal of the sub-assembly, and
  excitation means of the resonator with an input terminal constituting an excitation terminal of the sub-assembly,
  wherein, the output terminal of each sub-assembly is grounded by means of a corresponding resistive circuit and is connected to the excitation terminal of the following sub-assembly; and
 an output terminal formed by an output terminal of one of the sub-assemblies.

2. The oscillator according to claim 1, wherein the nanowire constitutes a movement detection means of piezoresistive type.

3. The oscillator according to claim 1, wherein each sub-assembly further comprises a plurality of nanowires connected in parallel between the first supply voltage and the output terminal of the sub-assembly.

4. The oscillator according to claim 1, wherein the resistive circuit is a resistance.

5. The oscillator according to claim 1, further comprising at least one additional set of four sub-assemblies, wherein
 a nanowire of each sub-assembly of the additional series is connected to an additional supply voltage, and
 a sub-assembly of the additional series is connected in parallel to the excitation terminal and output terminal of a corresponding sub-assembly of the first series.

6. The oscillator according to claim 1, further comprising one additional set of four sub-assemblies, wherein
 a nanowire of each sub-assembly of the additional set is connected to an additional supply voltage, the output terminal of each sub-assembly of the additional set is connected to the excitation terminal of the following sub-assembly, the output terminal of one of the sub-assemblies is connected to the output terminal of the oscillator, and the output terminal of the sub-assemblies of the additional series that is not connected to the output terminal of the oscillator is grounded by means of a corresponding resistive circuit.

7. The oscillator according to claim 1, wherein the resistive circuit is formed by at least one fixed nanowire.

8. The oscillator according to claim 1, wherein the excitation means of each sub-assembly comprises at least one electrode facing the nanowire or nanowires, and each electrode is connected to the excitation terminal of said excitation means.

* * * * *